(12) United States Patent
Lu et al.

(10) Patent No.: US 7,338,833 B2
(45) Date of Patent: Mar. 4, 2008

(54) DUAL DIELECTRIC STRUCTURE FOR SUPPRESSING LATERAL LEAKAGE CURRENT IN HIGH FILL FACTOR ARRAYS

(75) Inventors: Jeng Ping Lu, Mountain View, CA (US); Ping Mei, Palo Alto, CA (US); Francesco Lemmi, Menlo Park, CA (US); Robert A. Street, Palo Alto, CA (US); James B. Boyce, Los Altos, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/067,424

(22) Filed: Feb. 7, 2002

(65) Prior Publication Data

US 2002/0089026 A1 Jul. 11, 2002

Related U.S. Application Data

(62) Division of application No. 09/419,293, filed on Oct. 15, 1999, now Pat. No. 6,384,461.

(51) Int. Cl.
*H01L 21/00* (2006.01)

(52) U.S. Cl. .......................................... 438/79; 438/96

(58) Field of Classification Search ................ 438/38, 438/622, 624, 637, 778, 786, 787, 958, 981, 438/FOR. 515, FOR. 489, FOR. 493, 79, 438/96; 257/E31.048, E31.119, E31.062, 257/458, 444–446, 233
See application file for complete search history.

(56) References Cited

U.S. PATENT DOCUMENTS

| | | | | |
|---|---|---|---|---|
| 5,288,989 A | * | 2/1994 | Ishaque et al. | 250/214.1 |
| 5,463,225 A | * | 10/1995 | Kwasnick et al. | 250/370.11 |
| 5,499,207 A | * | 3/1996 | Miki et al. | 365/149 |
| 5,627,094 A | * | 5/1997 | Chan et al. | 438/253 |
| 5,712,506 A | * | 1/1998 | Shimoto et al. | 257/633 |
| 5,777,355 A | * | 7/1998 | Possin et al. | 257/233 |
| 5,858,832 A | * | 1/1999 | Pan | 438/250 |
| 6,180,529 B1 | * | 1/2001 | Gu | 438/706 |
| 6,229,192 B1 | * | 5/2001 | Gu | 257/458 |
| 6,384,461 B1 | * | 5/2002 | Lu et al. | 257/458 |

FOREIGN PATENT DOCUMENTS

| | | | |
|---|---|---|---|
| JP | 04056275 A | * | 2/1992 |
| WO | WO 9716836 A1 | * | 5/1997 |

\* cited by examiner

*Primary Examiner*—Matthew C. Landau
(74) *Attorney, Agent, or Firm*—Finnegan, Henderson, Farabow, Garrett & Dunner, L.L.P.

(57) ABSTRACT

A structure and method for suppressing lateral leakage current in full fill factor image arrays includes dual dielectric passivation layer. A first passivation layer includes a material that is an insulator, has a low dielectric constant to minimize capacitive coupling between the contacts, and is low stress to prevent cracking. A second passivation layer includes a thin oxide or nitride layer over the first passivation layer.

12 Claims, 5 Drawing Sheets

DUAL DIELECTRIC STRUCTURE FOR SUPPRESSING LATERAL LEAKAGE CURRENT IN HIGH FILL FACTOR ARRAYS

This is a division of application Ser. No. 09/419,293, filed Oct. 15, 1999, now U.S. Pat. No. 6,384,461 and which is incorporated herein by reference.

STATEMENT REGARDING FEDERALLY SPONSORED RESEARCH AND DEVELOPMENT

This invention was made with United States Government support under Agreement No. 70NANB7H3007 awarded by NIST. The United States Government has certain rights in this invention.

FIELD OF THE INVENTION

The present invention relates generally to the structure of a full fill factor image array and its method of manufacture, and more particularly to the structure of a full fill factor image array that reduces lateral leakage current and its method of manufacture.

BACKGROUND OF THE INVENTION

A conventional image array is typically formed of a plurality of photosensitive elements or pixels arranged in rows and columns. A conventional photosensitive element is shown in FIG. 1. Each photosensitive element (10) comprises photosensitive island (12) of amorphous silicon (a-Si) over a bottom contact pad (14) over a substrate (11). A transparent upper conductive layer (16) of indium tin oxide (ITO) resides over the assembly. A passivation layer (18) is disposed under the ITO (16) except where the ITO is in electrical contact with the upper surface of the of the photosensor island (12). The photosensitive element further includes a N+ doped region (22) and a P+ doped region (24). A conventional passivation layer (18) comprises an oxyinitride layer (26) and a polyamide layer (28).

In contrast to the conventional image arrays in which each pixel is defined by a stand alone PIN photosensitive element, the full fill factor image array improves the pixel fill factor by using continuous layers of amorphous silicon (a-Si) and P+ doped a-Si. The pixels in a high fill factor array are defined only by a mushroom shaped collection electrode.

A conventional full fill factor image array is shown in FIG. 2. The full fill factor image array (40) includes a plurality of source-drain metal contacts (44) on a substrate (42). For ease of description, other elements that may be formed on the substrate, such as gate lines, data lines, and thin film transistors (TFTs) are not shown. The source-drain metal contacts (44) are formed of an electrically conductive material such as a molybdenum and chromium alloy. They typically comprise one or more layers of metal. The source-drain metal contacts (44) are electrically connected to the switching and processing circuits (not shown).

To increase the area of carrier collection, a patterned mushroom-shaped collection electrode (46) is provided over the source-drain metal (44). Disposed on top of the mushroom shaped collection electrode is an N+ doped a-Si layer (48).

In contrast to a conventional image array using stand alone PIN photosensitive elements, the full fill factor image array uses a continuous intrinsic amorphous silicon (i a-Si) layer (50) and a continuous P+ doped a-Si layer (52). An upper electrode (54) of ITO resides on top of the P+ doped a-Si layer.

A conventional passivation layer comprises an oxynitride layer (56) deposited to thickness of about 1 micron by plasma enhanced chemical vapor deposition (PECVD). The passivation layer serves as the insulation between the source-drain metal (44) and photosensor (46, 48, and 50).

Like conventional photosensitive elements, the sensor structure of conventional full fill factor image arrays suffers from intrinsic leakage. Intrinsic leakage (58), represented in FIG. 2, arises due to material defects rather than the structure of the photosensitive element. The intrinsic leakage current of a 60×60 $\mu m^2$ stand alone PIN sensor, for example, is about 2 femto-amps (fA). In addition to intrinsic leakage, however, the conventional full fill factor image array structure suffers lateral leakage between pixels. This lateral leakage current causes image blurring effects and severely reduces the imager performance. The lateral leakage current for a 60×60 $\mu m^2$ full fill factor array may be as high as 0.3 pico-amps (pA) at 5 V.

The bulk conductivity of high quality intrinsic a-Si is less than $10^{-11}$ $(\Omega \cdot cm)^{-1}$ which is about $2 \times 10^{14}$ $\Omega$ between a 60×60 $\mu m^2$ pixel and its neighbor. Therefore, the intrinsic bulk conductivity of a-Si cannot be responsible for the high lateral leakage current. The most likely conducting mechanism for this lateral leakage current is conduction through the accumulated charge in the a-Si and oxynitride interface. Both the trapped positive ion in the oxynitride and the interface states in the a-Si/oxynitride interface can cause electron accumulation in the a-Si/oxynitride interface, creating a conducting channel between pixels.

One solution is to replace the passivation layer with another dielectric material such as silicon oxide or silicon nitride. Deposition rates for silicon oxide or silicon nitride, however, are usually much lower than for oxynitride. Therefore, deposition of a silicon nitride or silicon oxide passivation layer of about 1 micron would be impractical. In addition, other problems such as stress build-up may degrade the sensor structure.

In light of the foregoing, there is a need for a method and structure to reduce the lateral leakage current in full fill factor sensor arrays.

SUMMARY OF THE INVENTION

Accordingly, the present invention is directed to a high fill factor image array including a plurality of source-drain metal contacts disposed in an image array pattern, a dual dielectric passivation layer that suppresses lateral leakage current comprising a first passivation layer and a second passivation layer deposited over the first passivation layer, wherein the thickness of the second passivation layer is less than the thickness of the first passivation layer, a continuous layer of a-Si, a plurality of a patterned collection electrodes disposed on top of the source-drain metal contacts, a first doped silicon layer disposed over the collection electrodes a continuous second doped silicon layer, and an upper electrode.

In another aspect, the invention is directed to a method for making a high fill factor image array including the steps of providing a plurality of source-drain metal contacts, depositing a first passivation layer, depositing a second passivation layer that suppresses lateral leakage current, opening a plurality of via holes through the first and second passivation layers, depositing a layer of conductive material, depositing a first doped a-Si layer, patterning to form the collection electrodes, depositing a continuous layer of i a-Si, depositing a continuous second layer of doped a-Si, depositing and patterning an upper conductive layer.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate several embodiments of the invention and together with the description serve to explain the principles of the invention.

BRIEF DESCRIPTION OF THE DRAWINGS

The accompanying drawings, which are incorporated in and constitute a part of this specification, illustrate an embodiment of the invention and, together with the description, serve to explain the objects, advantages, and principles of the invention.

DETAILED DESCRIPTION OF THE PREFERRED EMBODIMENT

Reference will now be made in detail to the preferred embodiments of the invention, examples of which are illustrated in the accompanying drawings.

Figure 1:
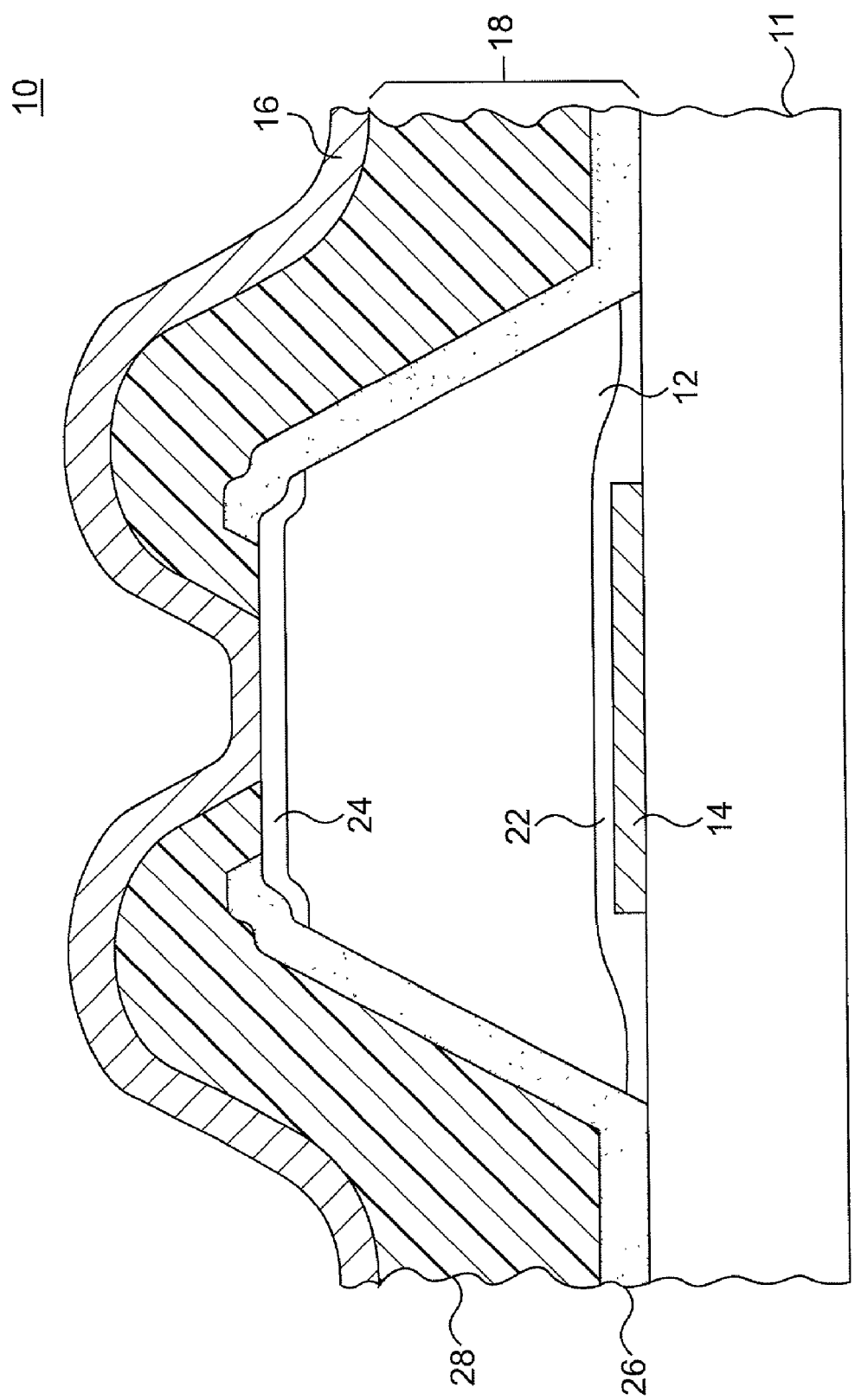
FIG. 1 is schematic cross sectional view of a prior art PIN photosensitive element.
Figure 2:
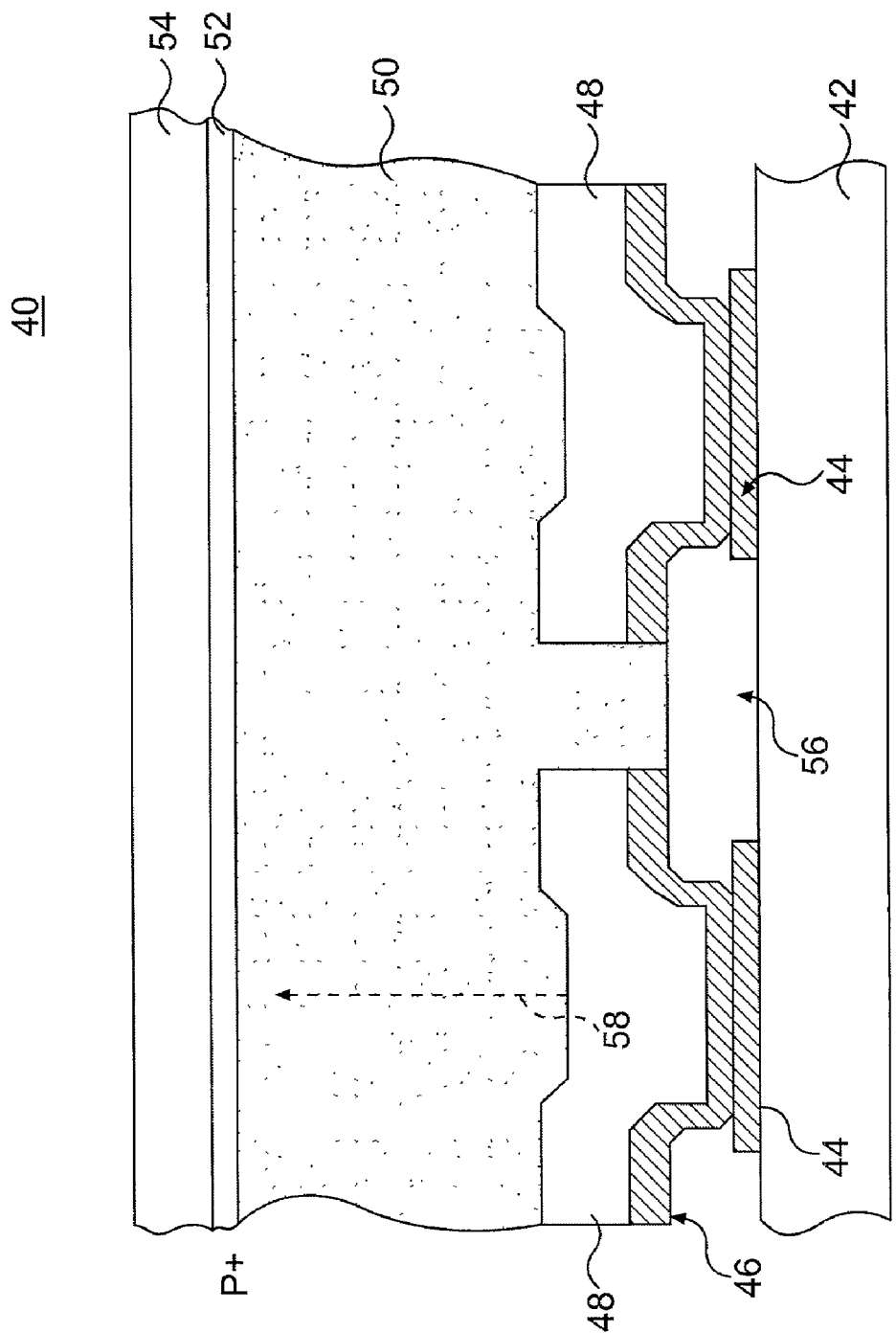
FIG. 2 is schematic cross sectional view of a prior art full fill factor sensor array.
Figure 3:
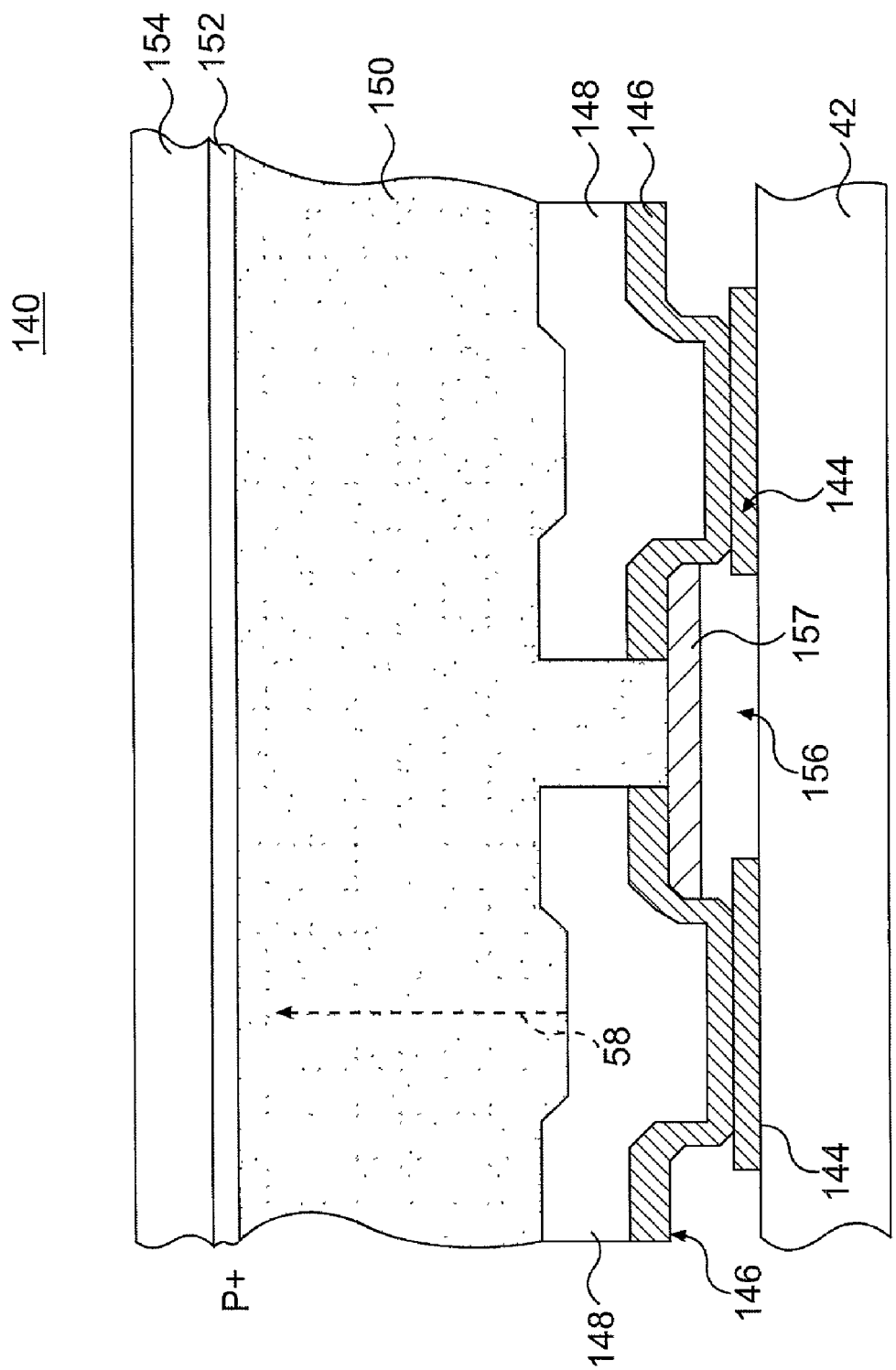
FIG. 3 is schematic cross sectional view of a dual dielectric passivation structure in a full fill factor sensor array according to one embodiment of the present invention.

FIG. 3 illustrates the components of a full fill factor sensor array formed in accordance with the principles of the present invention. According to one aspect of the invention, the fundamental components of an a full fill factor sensor array (140) include a plurality of source-drain metal contacts (144) arranged in rows and columns, a plurality of patterned mushroom shaped metal contacts (146) over the source-drain metal contacts, N+ doped a-Si regions (148) over the mushroom shaped collection electrodes (146), and a dual passivation layer (156, 157). The full fill factor sensor array further includes continuous layers of i a-Si (150) and P+ doped a-Si (152). An upper electrode layer (154) of, for example, ITO is disposed on top of the P+ a-Si layer.

The dual passivation layer (156, 157) includes a first dielectric layer (156) of a material that is an insulator, has a low dielectric constant to minimize capacitive coupling between the contacts, and is low stress to prevent cracking. Examples of passivation materials include silicon oxynitride, benzo-cyclo-butene (BCB), or polyimides. The thickness of the first passivation layer (156) depends on the material used and can be, for example, 1 to 5 μm. A first passivation layer (156) is preferably oxynitride with a thickness of about 1 micron.

A second dielectric layer (157) of, for example, an oxide or nitride is then deposited over the first dielectric layer. The thickness of the second dielectric layer (157) is not critical, but should be thinner than the first passivation layer. Preferably, the second passivation layer (157) should be a oxide with a thickness of about 1000 Å.

Figure 4:
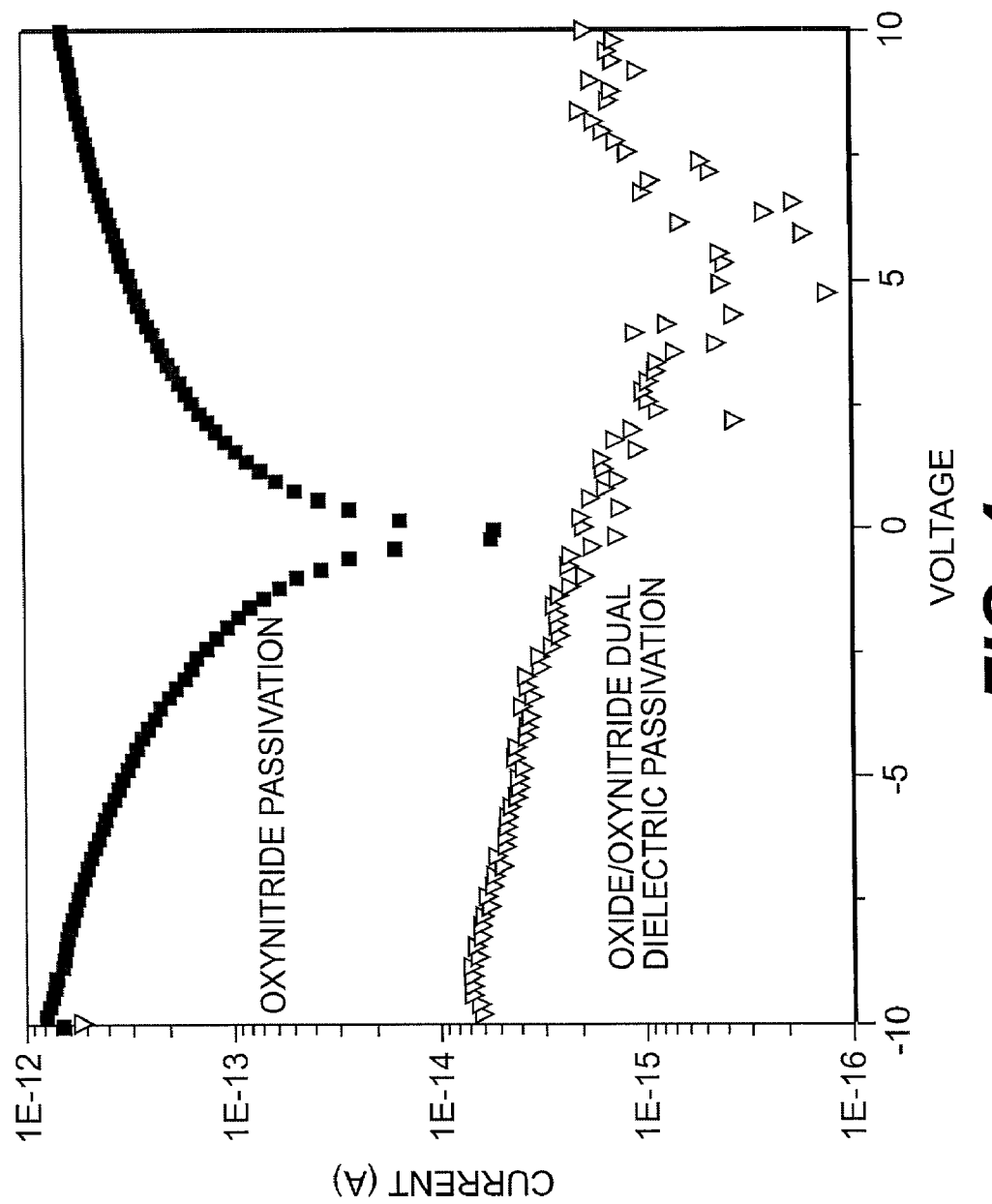
FIG. 4 is a plot of current versus voltage that shows the measured leakage current for a conventional sensor array and a sensor array with a dual dielectric passivation layer.

The dual dielectric passivation layers' (156, 157) effect on the lateral leakage current is demonstrated in FIG. 4. Lateral leakage current was directly measured on test arrays comprising 60 μm square pixels, 20 μm apart. In one test array a 1 micron thick oxynitride passivation layer was deposited. In a second test array, a dual dielectric passivation structure comprising a 1 micron thick oxynitride layer and a high quality oxide layer with thickness of about 1000 Å was deposited. In order to isolate the lateral leakage current out of the total leakage current which includes intrinsic leakage current and lateral leakage current, the P+ a-Si and ITO layers were not deposited on either test array. As shown in FIG. 4, the test array with the conventional oxynitride passivation layer showed a lateral leakage current as high as 0.3 pA at 5 volts. The measured lateral leakage current for the dual dielectric passivation structure according to one embodiment of the present invention is about 4 fA at 5V. Thus, the dual passivation layer structure reduces lateral leakage current by about two orders of magnitude over the conventional structure.

Figure 5A:
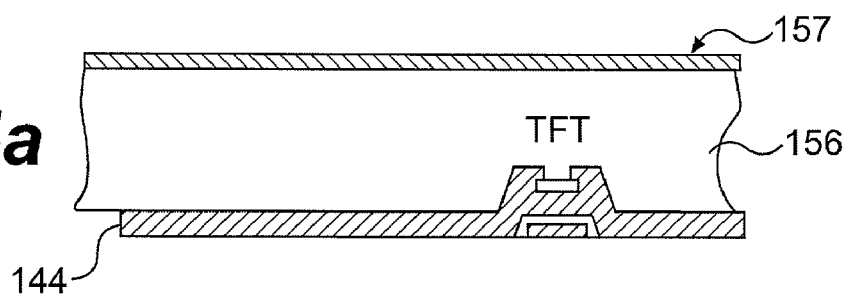
FIGS. 5a-d are cross-sectional views that schematically illustrates the steps in making the image array with the dual dielectric passivation layer according to one embodiment of the present invention.

The method of making the image array with the dual dielectric passivation layer according to one embodiment of the present invention is shown in FIGS. 5a-e. As shown in FIG. 5a, the first passivation layer (156) is deposited over the source drain metal contact (144) and a substrate (not shown) that includes gate lines (not shown), data lines (not shown), and switching circuits such as, for example, thin film transistors (TFT). The thickness of the first passivation layer (156) depends on the material used and can be deposited, for example, to a thickness of about 1 μm. An oxynitride layer can be deposited by, for example, plasma enhanced chemical vapor deposition (PECVD). A BCB layer can be deposited by, for example, spin coating or spray coating.

A second passivation layer (157) is then deposited over the first passivation layer. The second passivation layer (157) reduces the lateral leakage current and is, for example, a high quality oxide or nitride. The thickness of the second passivation layer (157) is not critical, but should be less than the first passivation layer. The second passivation layer is preferably an oxide with a thickness of about 1000 Å. It is preferably deposited by PECVD.

Figure 5B:
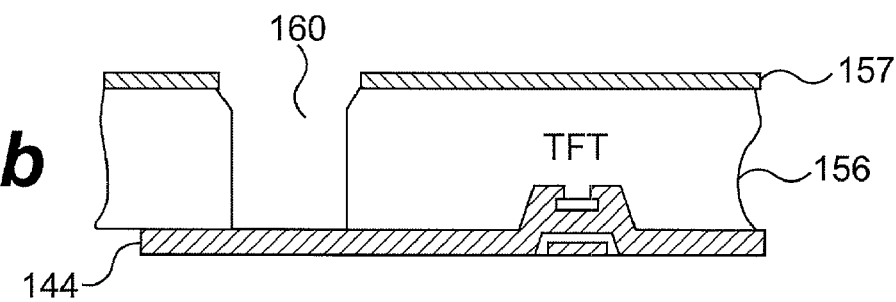
Figure 5C:
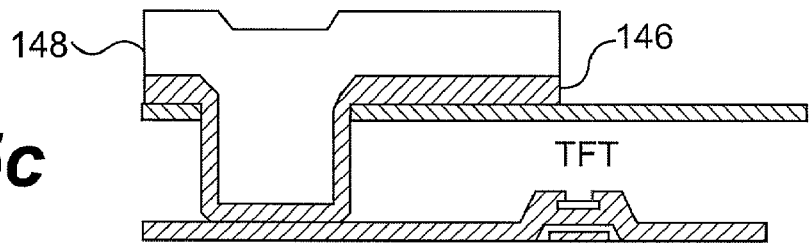

As shown in FIG. 5b, vias (160) are then opened to expose the source-drain metal (144). Via holes can be opened, for example, by etching through the first and second passivation layers. A metal layer is then deposited so that it contacts the source-drain metal contact. This is followed by deposition of a first doped a-Si layer (148). The first doped a-Si layer (148) can be, for example, N+ doped a-Si. The metal layer and the first doped a-Si layer (148) are then patterned, as shown in FIG. 5c, such that the patterning of the metal layer forms the mushroom shaped collection electrode (146) that defines the pixels.

Figure 5D:
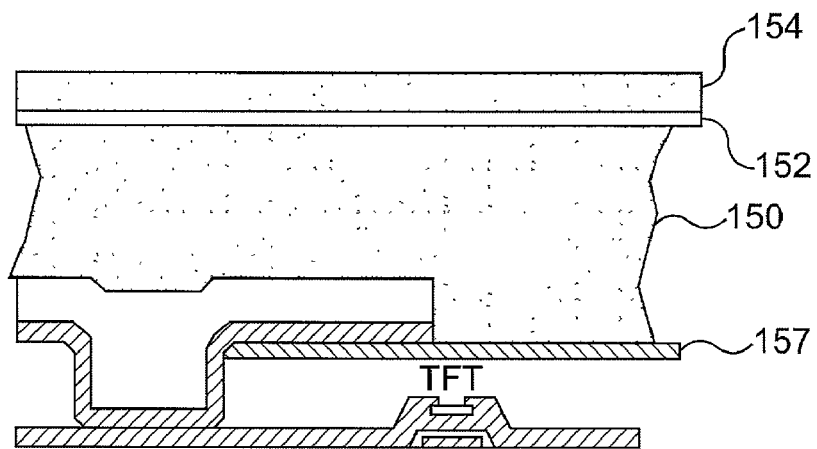

Then, as shown in FIG. 5d, a continuous layer of i a-Si (150) is deposited. A second doped a-Si layer (152) is deposited over the a-Si layer. The second doped a-Si layer (12) can be, for example, P+ doped a-Si. An upper electrode (154) of, for example, ITO is then deposited over the second doped a-Si layer. The ITO, a-Si, and P+ a-Si are then patterned, preferably in one lithography step.

It will be apparent to those skilled in the art that various modifications and variations can be made in the dual dielectric structure and the method for suppressing lateral leakage current of the present invention without departing from the spirit or scope of the invention. Thus, it is intended that the present invention cover the modifications and variations of this invention provided they come within the scope of the appended claims and their equivalents.

What is claimed is:

1. A method for making a high fill factor image array comprising the steps:
   providing a plurality of source-drain metal contacts on a substrate;
   depositing a first passivation layer over the plurality of source-drain metal contacts and the substrate;
   reducing the lateral leakage current between the plurality of source-drain metal contacts in the high fill factor image array by depositing a second passivation layer over the first passivation layer, the second passivation layer being thinner than the first passivation layer;
   opening a plurality of via holes through the first and second passivation layers to the plurality of source-drain metal contacts;
   depositing a layer of conductive material over the plurality of source-drain metal contacts and the second passivation layer;
   depositing a first doped a-Si layer as an optically active layer over the layer of conductive material;
   patterning the first doped a-Si layer and the layer of conductive material to form collection electrodes;
   depositing a continuous layer of i a-Si disposed on the second passivation layer and the first doped a-Si layer;
   depositing a continuous second layer of doped a-Si over the continuous layer of i a-Si;
   depositing an upper conductive layer over the second layer of doped a-Si; and
   patterning to form the image array.

2. The method for making a high fill factor image array according to claim 1, wherein the first passivation layer comprises silicon oxynitride, BCB, or a polyamide.

3. The method for making a high fill factor image array according to claim 1, wherein the second passivation layer is an oxide.

4. The method for making a high fill factor image array according to claim 1, wherein the second passivation layer has a thickness of about 1000 Å.

5. A high fill factor image array formed by:
   providing a plurality of source-drain metal contacts on a substrate;
   depositing a first passivation layer over the plurality of source-drain metal contacts and the substrate;
   reducing the lateral leakage current between the plurality of source-drain metal contacts in the high fill factor image array by depositing a second passivation layer over the first passivation layer, the second passivation layer being thinner than the first passivation layer;
   opening a plurality of via holes through the first and second passivation layers over the plurality of source-drain metal contacts;
   depositing a layer of conductive material on the plurality of source-drain metal contacts and over the second passivation layer;
   depositing a first doped a-Si layer as an optically active layer over the layer of conductive material;
   patterning the first doped a-Si layer and the layer of conductive material to form collection electrodes;
   depositing a continuous layer of i a-Si disposed on the second passivation layer and over the first doped a-Si layer;
   depositing a continuous second layer of doped a-Si over the continuous layer of i a-Si;
   depositing an upper conductive layer over the continuous second layer of doped a-Si; and
   patterning to form the image array.

6. The high fill factor image array of claim 5, wherein the first passivation layer comprises at least one of silicon oxynitride, BCB, or a polyimide.

7. The high fill factor image array of claim 5, wherein the second passivation layer is an oxide.

8. The high fill factor image array of claim 5, wherein the second passivation layer has a thickness of about 1000 Å.

9. A method for making a high fill factor image array comprising:
   providing a plurality of source-drain metal contacts;
   depositing a first passivation layer over the plurality of source-drain metal contacts;
   reducing the lateral leakage current between the plurality of source metal contacts in the high fill factor image array by depositing a second passivation layer over the first passivation layer being thinner than the first passivation layer;
   opening a plurality of via holes through the first and second passivation layers to expose the plurality of source-drain metal contacts;
   depositing a layer of conductive material on the plurality of source-drain metal contacts, such that the layer of conductive material makes electrical contact with the plurality of source-drain metal contacts;
   depositing a first doped a-Si layer as an optically active layer of conductive material;
   patterning the a-Si layer and the layer of conductive material to form collection electrodes;
   depositing sensor material comprising a continuous layer of i a-Si over the collection electrodes and at least a portion of the second passivation layer;
   depositing a continuous layer of doped a-Si over the continuous layer of i a-Si; depositing a conductive layer over the continuous layer of doped a-Si; and
   patterning conductive layer to form an upper electrode.

10. The method for making a high fill factor image array according to claim 9, wherein the first passivation layer comprises silicon oxynitride, BCB, or a polyamide.

11. The method for making a high fill factor image array according to claim 9, wherein the second passivation layer is an oxide.

12. The method for making a high fill factor image array according to claim 9, wherein the second passivation layer has a thickness of about 1000 Å.

* * * * *